(12) United States Patent
Chen (10) Patent No.: US 11,732,969 B2
(45) Date of Patent: Aug. 22, 2023

(54) WATER COOLING RADIATOR

(71) Applicant: Shenzhen Xunling Technology Co., Ltd., Shenzhen (CN)

(72) Inventor: Kang Chen, Shenzhen (CN)

(73) Assignee: SHENZHEN XUNLING TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/672,710

(22) Filed: Feb. 16, 2022

(65) Prior Publication Data

US 2023/0228493 A1 Jul. 20, 2023

(30) Foreign Application Priority Data

Jan. 14, 2022 (CN) .......................... 202220107188.X (51) Int. Cl.
| | |
|---|---|
| *H05K 7/20* | (2006.01) |
| *H01L 23/473* | (2006.01) |
| *F28F 9/02* | (2006.01) |
| *F28D 1/02* | (2006.01) |
| *F28F 3/02* | (2006.01) |

(52) U.S. Cl.
CPC ............ *F28D 1/0233* (2013.01); *F28F 3/025* (2013.01); *F28F 9/0256* (2013.01); *F28F 2250/08* (2013.01); *H01L 23/473* (2013.01); *H05K 7/20263* (2013.01); *H05K 7/20272* (2013.01)

(58) Field of Classification Search
CPC .............. H01L 23/473; H05K 7/20263; H05K 7/20272; F28F 9/02
See application file for complete search history.

(56) References Cited

U.S. PATENT DOCUMENTS

| 10,198,046 | B2* | 2/2019 | Tsai ........................... G06F 1/20 |
| 2016/0338223 | A1* | 11/2016 | Tsai ........................... F28F 3/12 |
| 2019/0187763 | A1* | 6/2019 | Chen ......................... F04D 1/06 |
| 2019/0239388 | A1* | 8/2019 | Tsai .................... H05K 7/20263 |
| 2020/0236807 | A1* | 7/2020 | Deng ..................... F28F 27/02 |
| 2021/0180890 | A1* | 6/2021 | Cheng ...................... F28D 1/04 |

(Continued)

FOREIGN PATENT DOCUMENTS

CN 208689537 U * 4/2019

OTHER PUBLICATIONS

Translation of CN208689537U entitled Translation-CN208689537U (Year: 2018).*

*Primary Examiner* — Paul Alvare
(74) *Attorney, Agent, or Firm* — Andrew C. Cheng (57) ABSTRACT

A water cooling radiator includes a water pump assembly and a water drain assembly. The water pump assembly includes a base and a housing spliced with the base to form an accommodating cavity. A water inlet portion and a water outlet portion in the accommodating cavity are formed on the base. The water inlet portion includes a water inlet tank provided on the base, a water inlet pump arranged in the water inlet tank and connected with the base, and a water inlet nozzle connected to the base and communicated with the water inlet tank. The water inlet tank is communicated with the water drain assembly. The water outlet portion includes a water outlet tank provided on the base, a water outlet pump arranged in the water outlet tank and connected with the base, and a water outlet nozzle connected to the base and communicated with the water outlet tank.

8 Claims, 5 Drawing Sheets

(56) References Cited

U.S. PATENT DOCUMENTS

2021/0385969 A1\* 12/2021 Geng .................... G06F 1/20
2022/0039290 A1\* 2/2022 Tsai .................... F04D 13/12
2022/0071058 A1\* 3/2022 Chen .................... F28F 9/18

\* cited by examiner

WATER COOLING RADIATOR

TECHNICAL FIELD

The present utility model belongs to the technical field of radiators, and particularly relates to a water cooling radiator.

BACKGROUND

When a computer is used, there will be high temperature in a host box, which is a big enemy of an integrated circuit. High temperature will not only lead to unstable operation of a system, shorten the service life, but also may burn some components. The function of a radiator is to absorb the heat and ensure proper temperature of the computer components. Radiators may be classified into types of air cooling, heat pipe, water cooling, semiconductor refrigeration, compressor refrigeration, etc. according to the way of heat dissipation. The water cooling radiator means that cooling liquid is driven by a water pump to forcibly circulate heat away from the radiator, and has the advantages of quietness, stable temperature reduction, less dependence on the environment, etc. than the air cooling radiator.

However, the existing water cooling radiator includes a water block and a water drain. A water path in the water block and a water path in the water drain are connected in series, so that a water pump in the water block drives the flow of refrigeration liquid in both bodies, thereby reducing the temperature of a Central Processing Unit (CPU). However, the existing water pump can drive a limited flow of cooling liquid, which easily leads to a poor heat dissipation effect of the water cooling radiator.

SUMMARY

An object of the present utility model is to provide a water cooling radiator to solve the technical problem of poor heat dissipation effect of a water cooling radiator in the prior art.

The present utility model is realized as follows:

A water cooling radiator includes a water pump assembly and a water drain assembly connected to the water pump assembly. The water pump assembly includes a base and a housing spliced with the base to form an accommodating cavity. A water inlet portion and a water outlet portion located in the accommodating cavity are formed on the base. The water inlet portion includes a water inlet tank provided on the base, a water inlet pump arranged in the water inlet tank and connected with the base, and a water inlet nozzle connected to the base and communicated with the water inlet tank. The water inlet tank is communicated with the water drain assembly. The water outlet portion includes a water outlet tank provided on the base, a water outlet pump arranged in the water outlet tank and connected with the base, and a water outlet nozzle connected to the base and communicated with the water outlet tank. The water inlet tank and the water outlet tank are arranged in parallel. The water inlet nozzle and the water outlet nozzle are arranged in parallel.

Further, the base is provided with a water inlet and a water outlet communicated with the water drain assembly, the water inlet is located in the water inlet tank, and the water outlet is located in the water outlet tank.

Further, the base is further provided with a water outlet groove communicated with the water outlet nozzle, which is communicated with the water outlet tank and the water drain assembly, the base is provided with a water outlet deflector for closing an end of the water outlet groove communicated with the water drain assembly, the base is further provided with a water inlet groove communicated with the water inlet nozzle, which is communicated with the water inlet tank and the water drain assembly, and the base is provided with a water inlet deflector for closing an end of the water inlet groove communicated with the water drain assembly.

Further, the water inlet pump includes a water inlet rotor housing, a water inlet impeller rotatably connected with the water inlet rotor housing, and a water inlet stator arranged on the water inlet rotor housing away from the water inlet impeller, and the water inlet impeller includes a water inlet rotating portion and a water inlet turbine portion that is located at a tank bottom of the water inlet tank; and the water outlet pump includes a water outlet rotor housing, a water outlet impeller rotatably connected with the water outlet rotor housing, and a water outlet stator arranged on the water outlet rotor housing away from the water outlet impeller, and the water outlet impeller includes a water outlet rotating portion and a water outlet turbine portion that is located at a tank bottom of the water outlet tank.

Further, the water drain assembly includes an upper water chamber having a water collection cavity and communicated with the base, a partition plate partitioning the water collection cavity into a water inlet cavity and a water outlet cavity is arranged in the upper water chamber, the water inlet cavity is communicated with the water inlet tank, and the water outlet cavity is communicated with the water outlet tank.

Further, an annular groove is recessed in a side of the upper water chamber facing the base, a forward projection area of the annular groove is greater than an opening area of the water collection cavity, a first sealing ring is embedded in the annular groove, and the first sealing ring is hermetically connected between the upper water chamber and the base.

Further, the water drain assembly further includes a lower water chamber, and a plurality of flow channel pipes spaced apart are connected between the upper water chamber and the lower water chamber.

Further, radiating fins are arranged between the adjacent flow channel pipes in a wave shape.

Further, the water drain assembly further includes a baffle plate arranged in the upper water chamber, the baffle plate is provided with a plurality of connecting portions in one-to-one correspondence with the flow channel pipes, the connecting portions protrude away from the lower water chamber, and the flow channel pipes penetrate through the connecting portions.

Further, the water cooling radiator further includes a central body for dissipating heat from a processor, an outer wall of the central body is respectively provided with a water inlet port and a water outlet port, the water inlet port, a water flow channel provided in the central body and the water outlet port are communicated successively, the water inlet port is communicated with the water outlet nozzle, and the water outlet port is communicated with the water inlet nozzle.

The present utility model has the following beneficial effects. The water inlet portion and the water outlet portion are provided to distinguish a water inlet operation and a water outlet operation of the water pump assembly, and the water inlet operation and the water outlet operation can be performed independently by respectively providing the water inlet pump and the water outlet pump. The water inlet operation and the water outlet operation of the water pump assembly can be completely independent by the water inlet tank accommodating the water inlet pump and the water outlet tank accommodating the water outlet pump, and the water inlet operation and the water outlet operation of the water pump assembly are difficult to interfere with each other. Compared with an operation condition of a conventional single water pump, double water pumps have the advantages of rapidly driving the flow of cooling liquid in the water drain assembly, increasing the flow rate and rapidly replacing cold and hot cooling liquid, so that the water cooling radiator can rapidly reduce the temperature of the processor.

REFERENCE NUMERALS 10, water pump assembly;
101, base; 111, housing;
102, water inlet portion; 112, water inlet tank; 122, water inlet pump; 122a, water inlet rotor housing; 122b, water inlet impeller; 122b1, water inlet rotating portion; 122b2, water inlet turbine portion; 122c, water inlet stator; 132, water inlet nozzle; 142, first connecting plate;
103, water outlet portion; 113, water outlet tank; 123, water outlet pump; 123a, water outlet rotor housing; 123b, water outlet impeller; 123b1, water outlet rotating portion; 123b2, water outlet turbine portion; 123c, water outlet stator; 133, water outlet nozzle; 143, second connecting plate;
104, first annular embedding groove; 114, second sealing ring;
105, second annular embedding groove; 115, third sealing ring;
106, water inlet;
107, water outlet;
108, water outlet groove;
109, water inlet groove;
20, water drain assembly; 201, upper water chamber; 211, annular groove; 202, partition plate; 203, water inlet cavity; 204, water outlet cavity; 205, first sealing ring; 206, lower water chamber; 207, flow channel pipe; 208, radiating fin; 209, baffle plate; 219, connecting portion;
30, central body; 301, water inlet port; 302, water outlet port; 303, radiating shovel tooth; 304, fourth sealing ring; 305, water outlet pipeline; 306, water inlet pipeline;
40, circuit control board;
50, water outlet deflector;
60, water inlet deflector;
70, side plate;
80, fan assembly.

DETAILED DESCRIPTION OF PREFERRED EMBODIMENTS

In order to make the objects, technical solutions and advantages of the present utility model clearer, the present utility model will be further described in detail below with reference to the accompanying drawings and embodiments. It should be understood that the specific embodiments described herein are illustrative only and are not intended to limit the present utility model.

It should be noted that when an element is referred to as being "fixed" or "arranged" on another element, it may be directly on the other element or intervening elements may also be present. When an element is referred to as being "connected" to another element, it may be directly connected to the other element or intervening elements may also be present.

It should also be noted that the orientation terms left, right, up, down, etc. in the present embodiment are merely relative concepts or references to the normal use of products, and should not be construed as limiting.

As shown in FIGS. 1 to 6, a water cooling radiator provided in an embodiment of the present utility model includes a water pump assembly 10 and a water drain assembly 20 connected to the water pump assembly 10. The water pump assembly 10 includes a base 101 and a housing 111 spliced with the base 101 to form an accommodating cavity. A water inlet portion 102 and a water outlet portion 103 located in the housing 111 are formed on the base 101. The water inlet portion 102 includes a water inlet tank 112 provided on the base 101, a water inlet pump 122 arranged in the water inlet tank 112 and connected with the base 101, and a water inlet nozzle 132 connected to the base 101 and communicated with the water inlet tank 112. The water inlet tank 112 is communicated with the water drain assembly 20. The water outlet portion 103 includes a water outlet tank 113 provided on the base 101, a water outlet pump 123 arranged in the water outlet tank 113 and connected with the base 101, and a water outlet nozzle 133 connected to the base 101 and communicated with the water outlet tank 113. The water inlet tank 112 and the water outlet tank 113 are arranged in parallel. The water inlet nozzle 132 and the water outlet nozzle 133 are arranged in parallel.

The water inlet portion 102 and the water outlet portion 103 are provided to distinguish a water inlet operation and a water outlet operation of the water pump assembly 10, and the water inlet operation and the water outlet operation can be performed independently by respectively providing the water inlet pump 122 and the water outlet pump 123. The water inlet operation and the water outlet operation of the water pump assembly 10 can be completely independent by the water inlet tank 112 accommodating the water inlet pump 122 and the water outlet tank 113 accommodating the water outlet pump 123, and the water inlet operation and the water outlet operation of the water pump assembly are difficult to interfere with each other. Compared with an operation condition of a conventional single water pump, double water pumps have the advantages of rapidly driving the flow of cooling liquid in the water drain assembly 20, increasing the flow rate and rapidly replacing cold and hot cooling liquid, so that the water cooling radiator can rapidly reduce the temperature of the processor.

As a specific embodiment, the water inlet portion 102 and the water outlet portion 103 may be arranged in series or in parallel according to actual needs. In the present embodiment, the water inlet portion 102 and the water outlet portion 103 are arranged in series.

Figure 1:
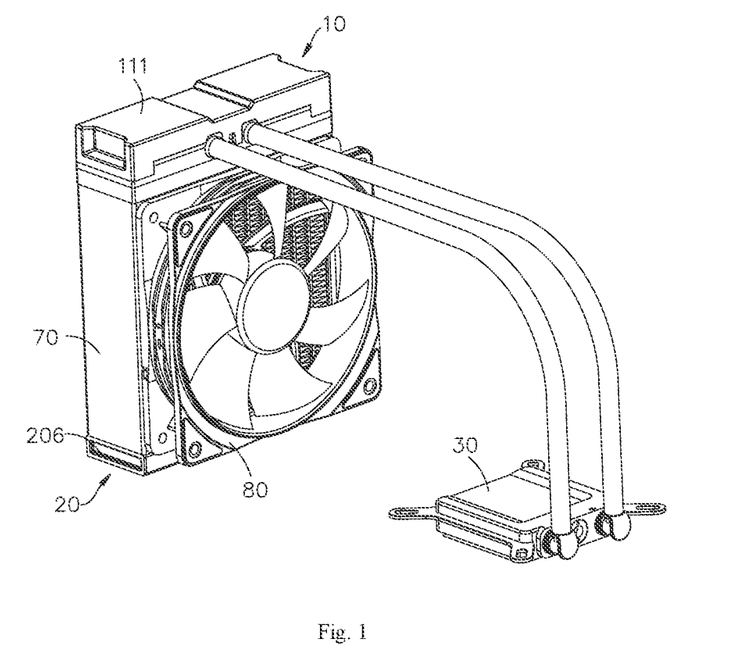
FIG. 1 is a perspective view of a water cooling radiator provided in an embodiment of the present utility model.
Figure 2:
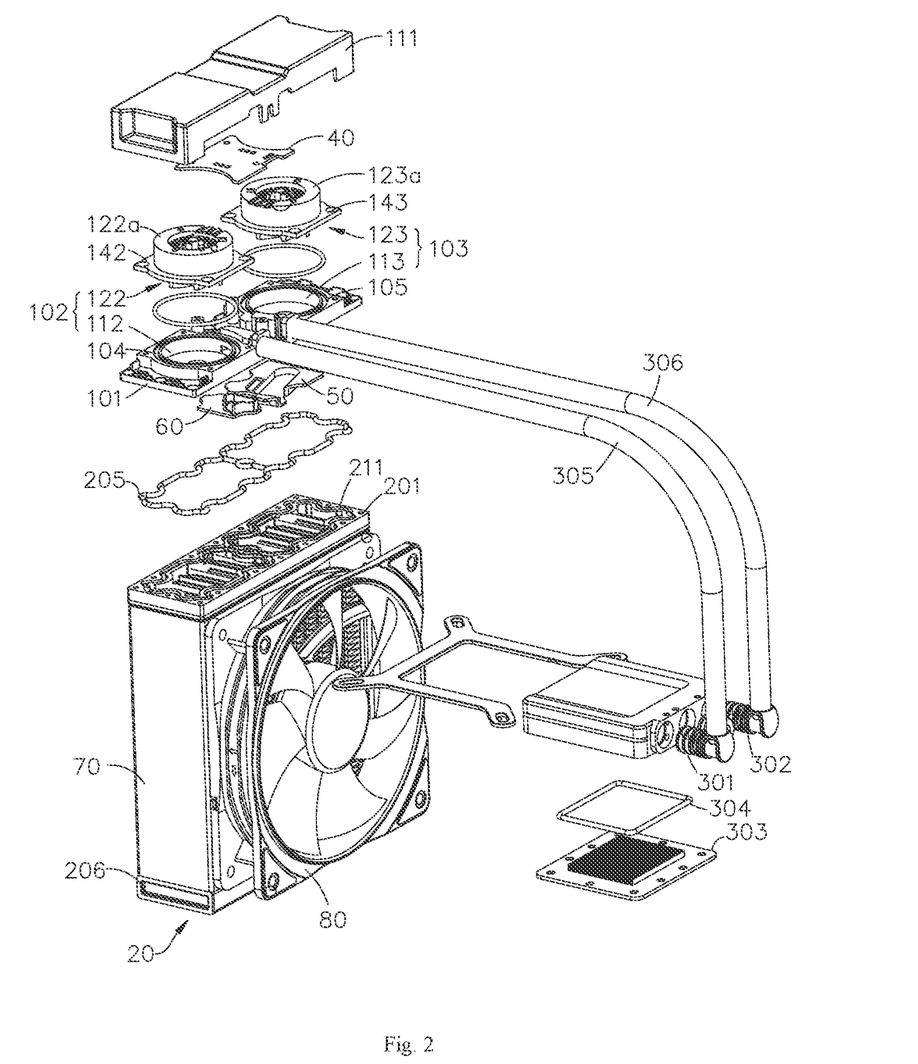
FIG. 2 is an exploded view of a water cooling radiator provided in an embodiment of the present utility model.
Figure 3:
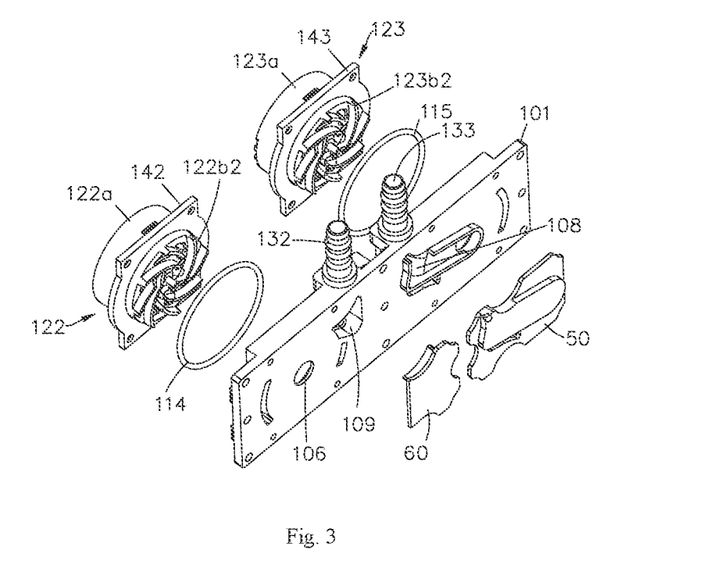
FIG. 3 is an exploded view of a water pump assembly of a water cooling radiator provided in an embodiment of the present utility model.
Figure 4:
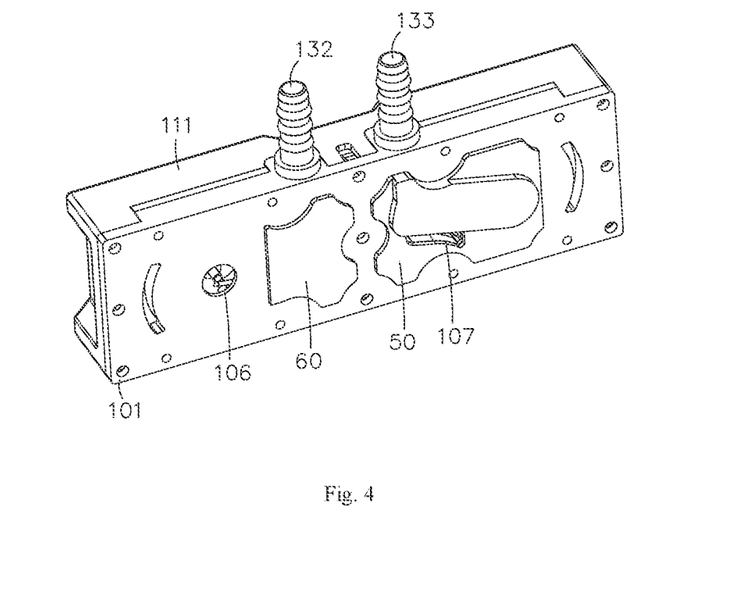
FIG. 4 is a perspective view of a water pump assembly of a water cooling radiator provided in an embodiment of the present utility model.

As a specific embodiment, referring to FIGS. 2 to 4, the water cooling radiator further includes a central body 30 for dissipating heat from a processor. An outer wall of the central body 30 is respectively provided with a water inlet port 301 and a water outlet port 302. The water inlet port 301, a water flow channel (not shown) provided in the central body 30 and the water outlet port 302 are communicated successively. The water inlet port 301 is communicated with the water outlet nozzle 133. The water outlet port 302 is communicated with the water inlet nozzle 132. An accommodating groove (not shown) is recessed in a side where the central body 30 is fitted to the processor. The water flow channel is communicated with the accommodating groove. The central body 30 includes a radiating shovel tooth 303 and a fourth sealing ring 304. The radiating shovel tooth 303 is fitted into the accommodating groove, and the fourth sealing ring 304 is located between the radiating shovel tooth 303 and the central body 30 to close the accommodating groove and prevent cooling liquid flowing into the accommodating groove from flowing out from a connection part of the radiating shovel tooth 303 and the central body 30.

Specifically, a water outlet pipeline 305 is communicated between the water inlet port 301 and the water outlet nozzle 133, and a water inlet pipeline 306 is communicated between the water outlet port 302 and the water inlet nozzle 132.

Figure 5:
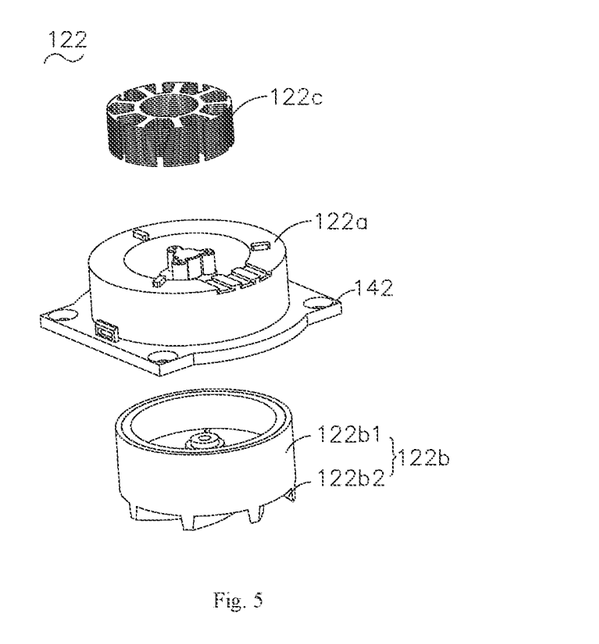
FIG. 5 is an exploded view of a water inlet pump of a water cooling radiator provided in an embodiment of the present utility model.

As a specific embodiment, referring to FIGS. 2, 3 and 5, the water inlet pump 122 includes a water inlet rotor housing 122a, a water inlet impeller 122b rotatably connected with the water inlet rotor housing 122a, and a water inlet stator 122c arranged on the water inlet rotor housing 122a away from the water inlet impeller 122b. The water inlet impeller 122b includes a water inlet rotating portion 122b1 and a water inlet turbine portion 122b2. The water inlet turbine portion 122b2 is located at a tank bottom of the water inlet tank 112. A first connecting plate 142 extends at an edge of the water inlet rotor housing 122a. A first annular embedding groove 104 is recessed in the base 101. A forward projection area of the first annular embedding groove 104 is greater than a forward projection area of the water inlet tank 112, so that a second sealing ring 114 arranged in the first annular embedding groove 104 abuts between the first connecting plate 142 of the water inlet rotor housing 122a and the base 101. Thus, the water inlet tank 112 can be sealed, so that cooling liquid in the water inlet tank 112 cannot flow into the accommodating cavity formed by splicing the housing 111 and the base 101.

The structure of the water outlet pump 123 is the same as the structure of the water inlet pump 122, and it is of course possible to adjust a water pump with different flow requirements according to actual needs. The water outlet pump 123 includes a water outlet rotor housing 123a, a water outlet impeller 123b rotatably connected with the water outlet rotor housing 123a, and a water outlet stator 123c arranged on the water outlet rotor housing 123a away from the water outlet impeller 123b. The water outlet impeller 123b includes a water outlet rotating portion 123b1 and a water outlet turbine portion 123b2. The water outlet turbine portion 123b2 is located at a tank bottom of the water outlet tank 113. A second connecting plate 143 extends at an edge of the water outlet rotor housing 123a. A second annular embedding groove 105 is recessed in the base 101. A forward projection area of the second annular embedding groove 105 is greater than a forward projection area of the water inlet tank 112, so that a third sealing ring 115 arranged in the second annular embedding groove 105 abuts between the second connecting plate 143 of the water outlet rotor housing 123a and the base 101. Thus, the water outlet tank 113 can be sealed, so that cooling liquid in the water outlet tank 113 cannot flow into the accommodating cavity formed by splicing the housing 11 and the base 101.

As a specific embodiment, referring to FIG. 2, a circuit control board 40 is arranged between the water outlet rotor housing 123a and the water inlet rotor housing 122a, and the circuit control board 40 is connected to the housing 111 and is located in the accommodating cavity formed by splicing the housing 111 and the base 101.

Referring to FIGS. 2 to 4, the base 101 is provided with a water inlet 106 and a water outlet 107 which are communicated with the water drain assembly 20. The water inlet 106 is located in the water inlet tank 112, and the water outlet 107 is located in the water outlet tank 113. By providing the water inlet 106 in the water inlet tank 112 on the base 101, the water inlet pump 122 pumps cooling liquid in the water drain assembly 20 into the water inlet tank 112 through the water inlet 106, and outputs the cooling liquid to the central body 30. By providing the water outlet 107 in the water outlet tank 113 on the base 101, the water outlet pump 123 enables the cooling liquid in the central body 30 conveyed to the water outlet tank 113 through the water outlet nozzle 133 to flow into the water drain assembly 20 from the water outlet 107, so as to realize the circulation of the cooling liquid in the water drain assembly 20 and the central body 30, and thus realize that the water cooling radiator can rapidly reduce the temperature of the processor.

Referring to FIGS. 3 and 4, the base 101 is further provided with a water outlet groove 108 communicated with the water outlet nozzle 133. The water outlet groove 108 is communicated with the water outlet tank 113 and the water drain assembly 20. The base 101 is provided with a water outlet deflector 50 for closing an end of the water outlet groove 108 communicated with the water drain assembly 20. Through the cooperation of the water outlet deflector 50 and the water outlet groove 108, the cooling liquid pumped from the water outlet nozzle 133 to the water outlet groove 108 by the water outlet pump 123 flows to the water drain assembly 20.

The base 101 is further provided with a water inlet groove 109 communicated with the water inlet nozzle 132. The water inlet groove 109 is communicated with the water inlet tank 112 and the water drain assembly 20. The base 101 is provided with a water inlet deflector 60 for closing an end of the water inlet groove 109 communicated with the water drain assembly 20. Through the cooperation of the water inlet deflector 60 and the water inlet groove 109, the cooling liquid pumped from the water inlet 106 to the water inlet nozzle 132 by the water inlet pump 122 flows to the central body 30, so that a circulating water path is formed between the water drain assembly and the central body 30, and the water inlet portion 102 and the water outlet portion 103 accelerate the flow of the cooling liquid, thereby achieving the operation of the water cooling radiator rapidly reducing the temperature of the processor.

Figure 6:
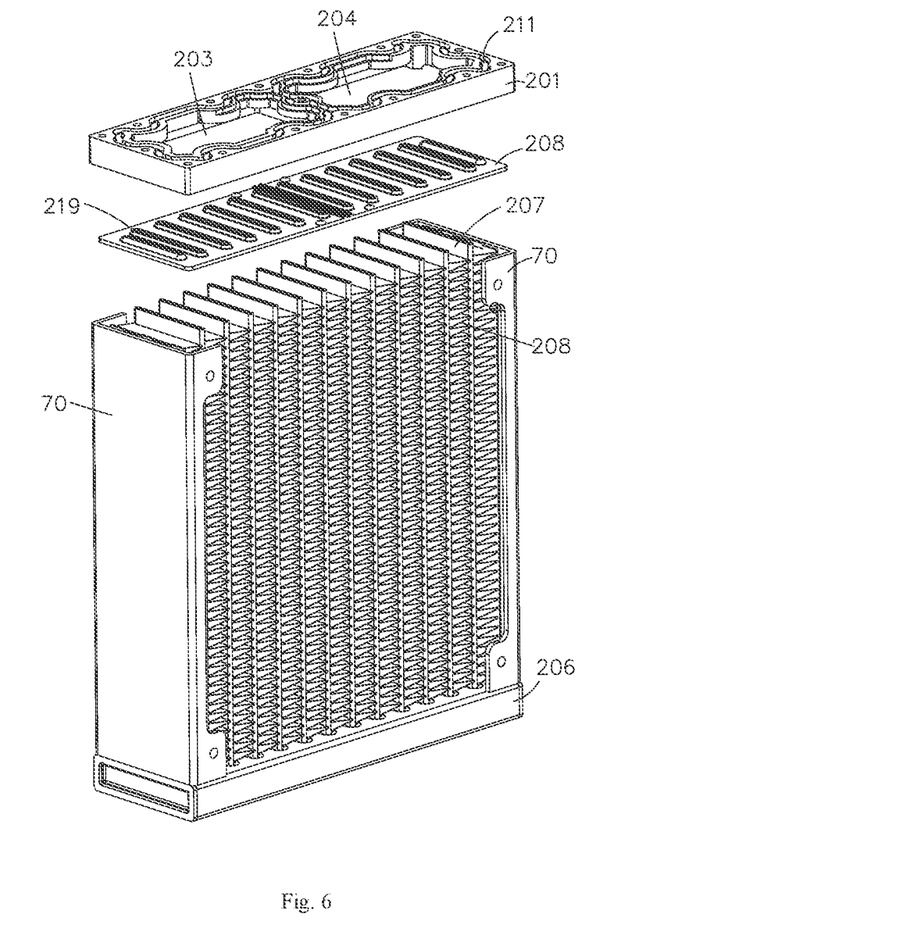
FIG. 6 is an exploded view of a water drain assembly of a water cooling radiator provided in an embodiment of the present utility model.

Referring to FIGS. 2 and 6, the water drain assembly 20 includes an upper water chamber 201 having a water collection cavity (not shown) and communicated with the base 101. A partition plate 202 partitioning the water collection cavity into a water inlet cavity 203 and a water outlet cavity 204 is arranged in the upper water chamber 201. The water inlet cavity 203 is communicated with the water inlet tank 112, and the water outlet cavity 204 is communicated with the water outlet tank 113. The water collection cavity of the upper water chamber 201 is divided into the water inlet cavity 203 and the water outlet cavity 204 through the partition plate 202. The water inlet cavity 203 is communicated with the water inlet tank 112, and the water outlet cavity 204 is communicated with the water outlet tank 113. Further, the water inlet portion 102 and the water outlet portion 103 are independent working areas. Then when the water cooling radiator is in a working state, the water inlet portion 102 pumps cooling liquid from the water drain assembly 20 through the water inlet cavity 203 and outputs the cooling liquid to the central body 30, and the water outlet portion 103 pumps cooling liquid in the central body 30 performing heat exchange with the processor into the water outlet cavity 204 through the water outlet cavity 204, and outputs the cooling liquid to the water drain assembly 20, so as to realize the cooling liquid circulation operation of the water cooling radiator. Therefore, the water cooling radiator has independent water circulation paths formed by the water inlet portion 102 and the water outlet portion 103, and the water circulation paths therein have a higher flow rate and a stronger temperature reduction performance than the water circulation paths formed by the conventional single water pump.

Specifically, the upper water chamber 201 has a water collection cavity, which is divided into two cavities: the water inlet cavity 203 and the water outlet cavity 204 by the partition plate 202 respectively. In some embodiments, a plurality of partition plates 202 may be set to divide the water collection cavity into a plurality of cavities according to actual situations of the circulating water path. Of course, a plurality of cavities may be provided with a water pump device having the same structure as that of the water inlet portion 102 so as to be independently operated when actually required.

Referring to FIGS. 2 and 6, an annular groove 211 is recessed in a side of the upper water chamber 201 facing the base 101, a forward projection area of the annular groove 211 is greater than an opening area of the water collection cavity, a first sealing ring 205 is embedded in the annular groove 211, and the first sealing ring 205 is hermetically connected between the upper water chamber 201 and the base 101. By setting the forward projection area of the annular groove 211 to be larger than the opening area of the water collection cavity, the contour of the first sealing ring 205 is larger than the opening area of the water collection cavity, so that the first sealing ring 205 is hermetically connected between the upper water chamber 201 and the base 101, a connection part between the base 101 and the upper water chamber 201 is sealed, and the cooling liquid is effectively prevented from overflowing therefrom.

Referring to FIG. 6, the water drain assembly 20 further includes a lower water chamber 206, and flow channel pipes 207 connected between the upper water chamber 201 and the lower water chamber 206. There are a plurality of flow channel pipes 207, and the plurality of flow channel pipes 207 are spaced apart. The lower water chamber 206 is provided so that the water drain assembly 20 stores cooling liquid. A plurality of flow pipes are arranged so that the upper water chamber 201 is communicated with the lower water chamber 206, and the flow rate of the cooling liquid flowing between the upper water chamber 201 and the lower water chamber 206 is achieved by the plurality of flow pipes. Specifically, the number of the flow channel pipes 207 arranged in the water inlet cavity 203 and the water outlet cavity 204 is the same.

Referring to FIG. 6, radiating fins 208 are arranged between the adjacent flow channel pipes 207, and the radiating fins 208 are arranged in a wave shape. The heat dissipation performance between the adjacent flow channel pipes 207 is increased by arranging the wave-shaped radiating fins 208 between the adjacent flow channel pipes 207.

Referring to FIG. 6, the water drain assembly 20 further includes a baffle plate 209 arranged in the upper water chamber 201. The baffle plate 209 is provided with a plurality of connecting portions 219 in one-to-one correspondence with the flow channel pipes 207. The connecting portions 219 protrude away from the lower water chamber 206, and the flow channel pipes 207 penetrate through the connecting portions 219. By means of the baffle plate 209 arranged in the upper water chamber 201 and the connecting portion 219 arranged on the baffle plate 209, an end of the flow channel pipe 207 facing away from the lower water chamber 206 is fixed. The connecting portion 219 protrudes toward the upper water chamber 201, and a side thereof facing the lower water chamber 206 is recessed, so that each of the flow channel pipes 207 can be rapidly assembled to the baffle plate 209.

As a specific embodiment, referring to FIG. 6, the lower water chamber 206 and the upper water chamber 201 are oppositely arranged, two side plates 70 are oppositely arranged between the upper water chamber 201 and the lower water chamber 206, and the two side plates 70, the upper water chamber 201 and the lower water chamber 206 enclose an accommodating cavity for accommodating the plurality of flow channel pipes 207, i.e. the two side plates 70, the upper water chamber 201 and the lower water chamber 206 are combined to form a square frame. And a fan assembly 80 is connected to one side of the square frame for dissipating heat from the radiating fins 208 and the flow channel pipes 207.

Working Process and Principle:

The cooling liquid in the water drain assembly 20 enters the water inlet portion 102 via the water inlet 106, and is distributed into the water outlet pipeline 305 through the water inlet deflector 60. The cooling liquid enters the central body 30 through the water outlet pipeline 305, passes through the water flow channel in the central body 30 and is output to the water inlet pipeline 306. The cooling liquid is conveyed into the water outlet portion 103 through the water inlet pipeline 306, and the cooling liquid is distributed by the water outlet deflector 50 and returned into the water drain assembly 20 through the water outlet 107. The cooling liquid in the water drain assembly 20 is subjected to temperature reduction by the fan assembly 80 and then enters circulation. The cooling liquid conveyed into the central body 30 is used to reduce the temperature of the processor, and continuously reduce the temperature of the processor through a circulating water path.

The above descriptions are merely preferred embodiments of the present utility model, and are not intended to limit the present utility model. Any modification, equivalent substitution or improvement within the spirit and principles of the present utility model should be included within the protection scope of the present utility model.

What is claimed is:

1. A water cooling radiator, comprising a water pump assembly and a water drain assembly connected to the water pump assembly, wherein the water pump assembly comprises a base and a housing spliced with the base to form an accommodating cavity, and a water inlet portion and a water outlet portion located in the accommodating cavity are formed on the base; the water inlet portion comprises a water inlet tank provided on the base, a water inlet pump arranged in the water inlet tank and connected with the base, and a water inlet nozzle connected to the base and communicated with the water inlet tank; the water inlet tank is communicated with the water drain assembly; the water outlet portion comprises a water outlet tank provided on the base, a water outlet pump arranged in the water outlet tank and connected with the base, and a water outlet nozzle connected to the base and communicated with the water outlet tank; and the water inlet tank and the water outlet tank are arranged in parallel, and the water inlet nozzle and the water outlet nozzle are arranged in parallel;

wherein the base is provided with a water inlet and a water outlet communicated with the water drain assembly, the water inlet is located in the water inlet tank, and the water outlet is located in the water outlet tank; and     wherein the base is further provided with a water outlet groove communicated with the water outlet nozzle, which is communicated with the water outlet tank and the water drain assembly, the base is provided with a water outlet deflector for closing an end of the water outlet groove communicated with the water drain assembly, the base is further provided with a water inlet groove communicated with the water inlet nozzle, which is communicated with the water inlet tank and the water drain assembly, and the base is provided with a water inlet deflector for closing an end of the water inlet groove communicated with the water drain assembly.

2. The water cooling radiator of claim 1, wherein the water inlet pump comprises a water inlet rotor housing, a water inlet impeller rotatably connected with the water inlet rotor housing, and a water inlet stator arranged on the water inlet rotor housing away from the water inlet impeller, and the water inlet impeller comprises a water inlet rotating portion and a water inlet turbine portion that is located at a tank bottom of the water inlet tank; and the water outlet pump comprises a water outlet rotor housing, a water outlet impeller rotatably connected with the water outlet rotor housing, and a water outlet stator arranged on the water outlet rotor housing away from the water outlet impeller, and the water outlet impeller comprises a water outlet rotating portion and a water outlet turbine portion that is located at a tank bottom of the water outlet tank.

3. The water cooling radiator of claim 1, wherein the water drain assembly comprises an upper water chamber having a water collection cavity and communicated with the base, a partition plate partitioning the water collection cavity into a water inlet cavity and a water outlet cavity is arranged in the upper water chamber, the water inlet cavity is communicated with the water inlet tank, and the water outlet cavity is communicated with the water outlet tank.

4. The water cooling radiator of claim 3, wherein an annular groove is recessed in a side of the upper water chamber facing the base, the annular groove surrounds an opening of the water collection cavity, a first sealing ring is embedded in the annular groove, and the first sealing ring is hermetically connected between the upper water chamber and the base.

5. The water cooling radiator of claim 4, wherein the water drain assembly further comprises a lower water chamber, and a plurality of flow channel pipes spaced apart are connected between the upper water chamber and the lower water chamber.

6. The water cooling radiator of claim 5, wherein radiating fins are arranged between the adjacent flow channel pipes in a wave shape.

7. The water cooling radiator of claim 3, wherein the water drain assembly further comprises a baffle plate arranged in the upper water chamber, the baffle plate is provided with a plurality of connecting portions in one-to-one correspondence with the flow channel pipes, the connecting portions protrude away from a lower water chamber, and the flow channel pipes penetrate through the connecting portions.

8. The water cooling radiator of claim 1, further comprising a central body for dissipating heat from a processor, wherein an outer wall of the central body is respectively provided with a water inlet port and a water outlet port, the water inlet port, a water flow channel provided in the central body and the water outlet port are communicated successively, the water inlet port is communicated with the water outlet nozzle, and the water outlet port is communicated with the water inlet nozzle.

\* \* \* \* \*